(12) United States Patent
Vest et al.

(10) Patent No.: US 7,237,482 B2
(45) Date of Patent: Jul. 3, 2007

(54) FLEXO PROCESSOR

(76) Inventors: Ryan Vest, 3420 Canyon Oak Way, Cumming, GA (US) 30041; Gary T. Markhart, 2904 Corte Celeste, Carlsbad, CA (US) 92009

( * ) Notice: Subject to any disclaimer, the term of this patent is extended or adjusted under 35 U.S.C. 154(b) by 189 days.

(21) Appl. No.: 11/055,196

(22) Filed: Feb. 10, 2005

(65) Prior Publication Data

US 2005/0211121 A1    Sep. 29, 2005

Related U.S. Application Data

(63) Continuation-in-part of application No. 10/811,763, filed on Mar. 29, 2004, now Pat. No. 6,998,218.

(51) Int. Cl.
*G03F 7/34* (2006.01)
(52) U.S. Cl. ............................ 101/401.1; 101/128.4; 101/430; 430/300; 430/306; 427/510
(58) Field of Classification Search ............... 430/5, 430/300, 306, 309, 330, 348, 413; 101/128.4, 101/401.1; 427/510
See application file for complete search history.

(56) References Cited

U.S. PATENT DOCUMENTS

| | | |
|---|---|---|
| 3,264,103 A | 8/1966 | Cohen et al. |
| 4,777,509 A | 10/1988 | Komatsubara et al. |
| 5,175,072 A | 12/1992 | Martens |
| 5,279,697 A | 1/1994 | Peterson et al. |
| 5,613,437 A * | 3/1997 | Motoe et al. ............. 101/128.4 |
| 5,666,617 A | 9/1997 | Goodman et al. |
| 5,717,985 A | 2/1998 | Labombard et al. |
| 5,798,019 A | 8/1998 | Cushner et al. |
| 5,916,403 A | 6/1999 | Cushner et al. |
| 5,925,500 A | 7/1999 | Yang et al. |
| 5,987,284 A | 11/1999 | Lewis |
| 6,006,059 A | 12/1999 | Till et al. |
| 6,180,325 B1 | 1/2001 | Gelbart |
| 6,309,799 B1 | 10/2001 | Ruckl |
| 6,496,676 B1 | 12/2002 | Caruthers, Jr. et al. |
| 6,531,184 B2 | 3/2003 | Bode et al. |
| 6,797,454 B1 * | 9/2004 | Johnson et al. ............. 430/306 |
| 7,041,432 B2 * | 5/2006 | Markhart ..................... 430/306 |
| 7,122,295 B2 * | 10/2006 | Mengel et al. .............. 430/306 |
| 2002/0178953 A1 * | 12/2002 | Cacchi ....................... 101/485 |
| 2003/0180655 A1 | 9/2003 | Fan et al. |
| 2003/0211423 A1 | 11/2003 | Mengel et al. |

FOREIGN PATENT DOCUMENTS

| | | |
|---|---|---|
| EP | 1 239 329 A2 | 9/2002 |
| WO | WO 01/18604 A2 | 3/2001 |
| WO | WO 01/88615 A1 | 11/2001 |

* cited by examiner

*Primary Examiner*—Daniel J. Colilla
*Assistant Examiner*—Kevin D. Williams
(74) *Attorney, Agent, or Firm*—Carmody & Torrance LLP (57) ABSTRACT

An improved flexo processor and a method of using the improved flexo processor to increase the flexibility of both the type and the size of the flexographic printing element that may be processed. The novel thermal plate processor system is capable of processing both flat and round photosensitive printing elements with only minimal changes to the system. The thermal plate processor system may also include means for exposure and post-exposure/detack in the same system.

42 Claims, 4 Drawing Sheets

FLEXO PROCESSOR

CROSS REFERENCE TO RELATED APPLICATIONS

This application is a continuation-in-part of patent application Ser. No. 10/811,763, filed Mar. 29, 2004 now U.S. Pat. No. 6,998,218, the subject matter of which is herein incorporated by reference in its entirety.

FIELD OF THE INVENTION

The present invention is directed to an improved flexo processor and a method of using the improved flexo processor to increase the flexibility of both the type and the size of the flexographic printing element that may be processed.

BACKGROUND OF THE INVENTION

Flexography is a method of printing that is commonly used for high-volume runs. Flexography is employed for printing on a variety of substrates such as paper, paperboard stock, corrugated board, films, foils and laminates. Newspapers and grocery bags are prominent examples. Coarse surfaces and stretch films can be economically printed only by means of flexography. Flexographic printing plates are relief plates with image elements raised above open areas. Such plates offer a number of advantages to the printer, based chiefly on their durability and the ease with which they can be made.

Although photopolymer printing elements are typically used in "flat" sheet form, in some applications, there are advantages to using the printing element in a continuous cylindrical form, as a continuous in-the-round (CITR) photopolymer sleeve. CITR photopolymer sleeves add the benefits of digital imaging, accurate registration, fast mounting, and no plate lift to the flexographic printing process. CITR sleeves have applications in the flexographic printing of continuous designs such as in wallpaper, decoration and gift-wrapping paper, and other continuous designs such as tablecloths, etc. CITR sleeves enable flexographic printing to be more competitive with gravure and offset on print quality.

A typical flexographic printing plate as delivered by its manufacturer, is a multi-layered article made of, in order, a backing or support layer, one or more unexposed photocurable layers, a protective layer or slip film, and a cover sheet. A typical CITR photopolymer sleeve generally comprises a sleeve carrier (support layer) and at least one unexposed photocurable layer on top of the support layer.

It is also highly desirable in the flexographic prepress printing industry to eliminate the need for chemical processing of printing elements in developing the relief images, in order to go from plate to press more quickly. Processes have been developed whereby photopolymer printing plates are prepared using heat and the differential melting temperature between cured and uncured photopolymer is used to develop the latent image. The basic parameters of this process are known, as described in U.S. Pat. Nos. 5,279,697, 5,175,072 and 3,264,103, in published U.S. patent publication Nos. U.S. 2003/0180655, and U.S. 2003/0211423, and in WO 01/88615, WO 01/18604, and EP 1239329, the teachings of each of which are incorporated herein by reference in their entirety. These processes allow for the elimination of development solvents and the lengthy plate drying times needed to remove the solvent. The speed and efficiency of the process allow for its use in the manufacture of flexographic plates for printing newspapers and other publications where quick turnaround times and high productivity are important.

The photocurable layer allows for the creation of the desired image and provides a printing surface. The photocurable compositions used generally contain binders, monomers, photoinitiators, and other performance additives. Photocurable compositions useful in the practice of this invention include those described in U.S. patent application Ser. No. 10/353,446 filed Jan. 29, 2003, the teachings of which are incorporated herein by reference in their entirety. Various photopolymers such as those based on polystyrene-isoprene-styrene, polystyrene-butadiene-styrene, polyurethanes and/or thiolenes as binders may be used. Preferred binders include polystyrene-isoprene-styrene, and polystyrene-butadiene-styrene, especially block co-polymers of the foregoing.

The composition of the photocurable layer should be such that there exists a substantial difference in the melt temperature between the cured and uncured polymer. It is precisely this difference that allows the creation of an image in the photocurable layer when heated. The uncured photopolymer (i.e., the portions of the photocurable layer not contacted with actinic radiation) melts or substantially softens while the cured photopolymer remains solid and intact at the temperature chosen. The difference in melt temperature allows uncured photopolymer to be selectively removed, thereby creating an image.

The printing element is then selectively exposed to actinic radiation, which is traditionally accomplished in one of three related ways. In the first alternative, a photographic negative with transparent areas and substantially opaque areas is used to selectively block the transmission of actinic radiation to the printing plate element. In the second alternative, the photopolymer layer is coated with an actinic radiation (substantially) opaque layer, which is also sensitive to laser ablation. A laser is then used to ablate selected areas of the actinic radiation opaque layer creating an in situ negative, and the printing element is then flood exposed through the in situ negative. In the third alternative, a focused beam of actinic radiation is used to selectively expose the photopolymer. Any of these alternative methods produces an acceptable result, with the criteria being the ability to selectively expose the photopolymer to actinic radiation, thereby selectively curing portions of the photopolymer.

Once the photocurable layer of the printing element has been selectively exposed to actinic radiation, it may then be developed using heat. As such, the printing element is generally heated to at least about 70° C. The exact temperature will depend upon the properties of the particular photopolymer being used. However, two primary factors should be considered in determining the development temperature:

1. The development temperature is preferably set between the melt temperature of the uncured photopolymer on the low end and the melt temperature of the cured photopolymer on the upper end. This allows selective removal of the photopolymer, thereby creating the image.
2. The higher the development temperature, the quicker the process time will be. However, the development temperature should not be so high as to exceed the melt temperature of the cured photopolymer or so high that it will degrade the cured photopolymer. The temperature should be sufficient to melt or substantially soften the uncured photopolymer thereby allowing it to be removed.

Once the heated printing element has been developed, uncured photopolymer can be melted or removed. In most instances, the heated printing element is contacted with a material that will absorb or otherwise remove the softened or melted uncured photopolymer. This removal process is generally referred to as "blotting." Blotting is typically accomplished using a screen mesh or an absorbent fabric. Either woven or non-woven fabric is used and the fabric can be polymer-based or paper, so long as the fabric can withstand the operating temperatures involved. In most instances, blotting is accomplished using rollers to bring the material and the heated printing plate element into contact. One example of this process is described in U.S. Pat. No. 5,175,072 to Martens, the subject matter of which is herein incorporated by reference in its entirety.

Upon completion of the blotting process, the printing plate element is preferably post-exposed to further actinic radiation in the same machine, cooled, and is then ready for mounting on a printing press.

Depending upon the particular application, the printing element may also comprise other optional components. For instance, it is frequently preferable to use a removable coversheet over the photocurable layer to protect the layer during handling. If used, the coversheet is removed either just before or just after the selective exposure to actinic radiation. Other layers such as slip layer or masking layers as described in U.S. Pat. No. 5,925,500 to Yang et al. and in U.S. Pat. No. 6,238,837 to Fan, the teachings of each of which are incorporated herein by reference in their entirety, may also be used.

Equipment designed for thermally processing flexographic printing plates has traditionally been designed to accommodate plates of a particular size and shape, with larger sizes and shapes requiring substantially larger and more expensive equipment. In addition, one of the major drawbacks to many of the current thermal development systems is that these systems can only be used with flat plates, which must then be mounted after development. This requires an additional machine and more time, and can also result in a loss in accuracy when registration between multiple plates and colors is required. Thus, there remains a need in the art for a thermal developing system that is easily adaptable for processing printing elements of various sizes and shapes.

Furthermore, current thermal development systems using heated rolls for blotting away the uncured photopolymer have typically used only one heated roll that is of approximately the same width as the plate, which increases the difficulty in making printing elements of different sizes. In addition, other problems may arise when attempting to make the blotting machine of the thermal system larger to accommodate larger printing elements. A tremendous amount of force (approximately 100 pounds/linear inch) must be applied by the heated roll to force the blotting material into the image on the printing element, which can cause the heated roll to bend, resulting in an uneven floor. Also, the heating and blotting process must often be repeated several times in order to obtain effective removal of the uncured photopolymer.

U.S. Pat. No. 6,180,325 to Gelbart, the subject matter of which is herein incorporated by reference in its entirety suggests a method of applying a patterned coating to a printing element to form a mask and subsequently exposing the printing element to actinic radiation without dismounting it from the apparatus where the coating is applied. However, there is no suggestion in Gelbart that exposing and thermal development steps can be accomplished in the same apparatus.

Furthermore, exposing, developing and post exposure/detack steps have traditionally been carried out in separate devices. This requires additional time to transfer the printing element from the exposure device to the development device and can affect the quality of the finished plate as a result of handling the printing element. Thus, it would be desirable to accomplish the exposing, developing and post exposure/detack steps in the same apparatus in order to improve both the quality and the accuracy of the final product.

The basic design of the current in the round (ITR) processor is excellent for the processing cylindrical plate types, including both continuous and plate-on-sleeve types. However, if the ITR processor also had a device comparable in function to the mounting cylinder of the laser imager, it could be used for both flat and round plate types. For example, a user of cylindrical plates could continue to use the existing setup, changing mandrels as needed to ensure a proper fit between the base sleeve and the mandrel. A user wishing to process flat plates would exchange the mandrel for a mounting cylinder that would allow the attachment of flat plates to the outside of the cylinder using a vacuum, physical clamp, or some other means. The attachment of the plate can be automated, after the fashion that is already used in laser imaging devices. Moreover, the current laser imaging mounting cylinders could be used directly in an ITR-type processor.

Current laser imaging machines utilize a mounting cylinder to allow flat plate materials to be attached to the outside of the cylinder so that their masks may be laser ablated. Commercial laser imaging machines are available, for example, from Creo, Inc. and Esko-Graphics, among others. Some of these laser imaging machines include a feature by which a flat plate can automatically be drawn into the imager and held to the mounting cylinder by suitable means, such as vacuum, an edge clamp, or both vacuum and an edge clamp. It would be highly desirable to use features of this technology during thermal plate processing.

The inventors of the present invention have developed an improved thermal flexo processor that can be used to process both flat plates and CITR printing elements, and which has the further advantage of being easily scaled up or down in size by the manufacturer. Furthermore, such a device can be combined with other processes necessary for flexographic plate processing in a way that allows a single machine to combine digital ablation, exposure, processing and post-exposure steps in a single system. The net result is to create a thermal plate processor that is capable of processing both flat and round photosensitive printing elements with only minor changes, which would offer an unprecedented amount of flexibility to the system's users.

SUMMARY OF THE INVENTION

It is an object of the present invention to provide an improved plate processor system that can interchangeably process printing elements of different sizes and shapes quickly and easily.

It is another object of the present invention to provide an improved plate processor system that can perform multiple steps of the manufacturing process in a single system.

To that end, the present invention is directed to an improved plate processor system for manufacturing a flexographic printing element, the plate processor system comprising:
  a drive system;
  a rotatable support interchangeably couplable to the drive system;

means for securing the flexographic printing element on the rotatable support;

means for exposing imaged surfaces of the flexographic printing element to actinic radiation;

means for thermally developing the imaged and exposed surfaces of the flexographic printing element; and optionally, means for post-exposing and detacking the flexographic printing element.

The invention is also directed to a method of using the plate processor system of the invention to manufacture flexographic printing elements with greater flexibility than has previously been achieved.

DETAILED DESCRIPTION OF THE PREFERRED EMBODIMENTS OF THE INVENTION

The present invention is directed to an improved thermal flexo processor that can be used to process both flat plates and CITR printing elements, and which has the further advantage of being easily scaled up or down in size by the manufacturer. One of the drawbacks to most flexo plate processors is that they are limited by the length of the cylinder on which the printing element is mounted. Therefore, a key advantage to the novel flexo plate processor of the invention is that that printing elements of various sizes and shapes can be processed.

The present invention is directed to a single machine designed with spacers of various sizes that can be added to the machine to make it longer and therefore capable of processing a broader range of plate sizes. Because a plate processor with such a design is limited only by the length of the mandrel or cylinder used, it is easy to use a similar machine design across a wide range of machine sizes. This is possible because the processing device, the pressure and blotter roll unit, move across the length of the cylinder rather than across its entire width all at once. While different cylinder sizes and lengths are still required to effect this change, the net complexity and cost of the improved system of the invention is still far less than the alternative of needing different systems for each plate size.

In another embodiment, it is also possible that a second or third processing device can be added to the system of the invention in its larger sizes to speed the processing time.

The improved thermal processor of the invention is also highly amenable to being combined with other processes needed to move a plate from its as-manufactured state to a print-ready state. Because these other processes, such as laser mask ablation, UV exposure, and post-exposure can be easily adapted to operate linearly and in sequence with the inventive thermal processing system for plates and sleeves, it is also possible to use a single system that can perform all of the functions of the invention using only a small fraction of the space that is currently required by separate units.

The present invention relates to an improved flexo plate processor system and a method of using the flexo plate processor system to manufacture a flexographic printing element. The improved flexo plate processor system combines several steps of the plate manufacturing process in the same system, including some or all of the imaging, exposing, developing, and post exposure/detack steps.

Flexographic printing elements that may be processed in the flexo plate processor of the invention are generally produced from photocurable printing blanks by imaging the photocurable printing blank to produce a relief image on the surface of the printing element. This imaging step is generally accomplished by selectively exposing the photocurable material to actinic radiation, which exposure acts to harden or crosslink the photocurable material in the irradiated areas and may take place in the flexo plate processor or be accomplished before the plate is processed through the flexo plate processor system of the invention. Areas that are not crosslinked or cured in the imaging step may then be removed in the subsequent developing step.

In a preferred embodiment, the novel thermal developing system of the invention is combined with the exposure device so that the printing element may be exposed and developed in the same system without the need to remove the printing element from the exposing device to place it into the developing system. In another embodiment, the system of the invention also contains means for post exposure/detack of the exposed and developed printing element.

The photocurable printing blank contains one or more layers of an uncured photocurable material on a suitable backing layer. The photocurable printing blank can be in the form of a continuous (seamless) sleeve or as a flat, planar plate that is mounted on a carrier sleeve.

The present invention is directed to an improved plate processor system (10) for manufacturing flexographic printing elements, including both printing sleeves and flat plates. The improved plate processor system (10) comprises a drive system (6) and a rotatable support (2) interchangeably couplable to the drive system (6). The rotatable support (2) comprises means for securing a flexographic printing element (16) on the rotatable support (2). The improved plate processor system (10) also comprises means for thermally developing the imaged and exposed surfaces of the flexographic printing element (16). Preferably, the improved plate processor system (10) of the invention comprises means for exposing imaged surfaces of the flexographic printing element (16) to actinic radiation. Optionally, but preferably, the improved plate processor system (10) of the invention also comprises means for post-exposing and detacking the flexographic printing element (16).

In one embodiment, the flexographic printing element (16) is a flat plate and the rotatable support (2) is a mounting cylinder. In this embodiment, the means for securing the flexographic printing element (16) on the mounting cylinder (rotatable support (2)) are preferably selected from the group consisting of physical clamps, magnetic clamps, vacuum, and combinations of the foregoing. Other means of securing the flexographic printing element (16) to the mounting cylinder (2) would also be known to those skilled in the art and are usable in the invention.

In another embodiment, the flexographic printing element (16) is a substantially seamless photosensitive printing sleeve and the rotatable support (2) is a mandrel. The printing sleeve may be integrally formed on the mandrel, such as described in U.S. patent application Ser. No. 10/754,297, filed Jan. 9, 2004, the subject matter of which is herein incorporated by reference in its entirety. Alternatively, the printing sleeve may be pre-formed and then attached to the mandrel using an adhesive, i.e., double-sided tape.

The drive system (6) is used to control the movement, i.e., the rotation of the rotatable support (2). In order to accommodate rotatable supports (2) of various lengths, one or more spacers (4) may be used to couple the rotatable support (2) to the drive system (6). This is a key feature of the system of the invention as it allows for much greater flexibility in processing flexographic printing elements of various shapes of sizes to processed in a single plate processor system.

Another key feature of the system of the invention is the use of a controller (7), which is typically a microprocessor. The controller (7) may be programmed with data for various dimensions of flexo plates that may be processed in the flexo plate processor system of the invention. In addition, one or more sensors (8) may be used to determine the dimensions of the flexographic printing element and be coupled to the controller to provide the controller with data. The controller (7) is couplable to the drive system (6) and also couplable to the reciprocating carriage(s) (26) (shown best in FIG. 2) that controls the movement of at least one of the means for exposing, the means for thermally developing, and/or the means for post-exposure/detacking. Thus, the rotational speed of the rotatable support as well as the speed and reciprocating motion of the carriage(s) can be adjusted by the controller (7) to achieve a good result.

Figure 1:
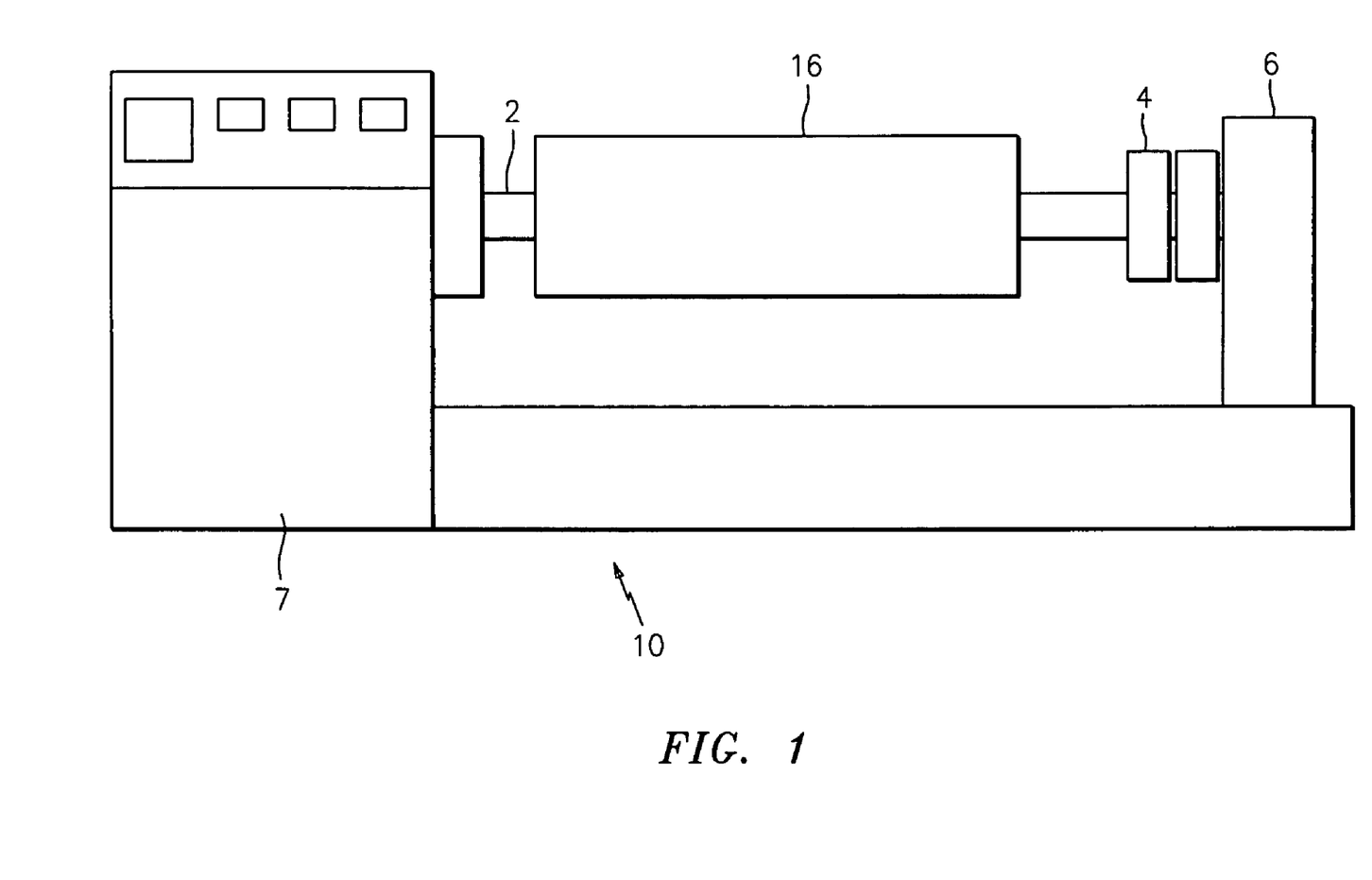
FIG. 1 depicts one embodiment of the thermal plate processor system of the instant invention.
Figure 2:
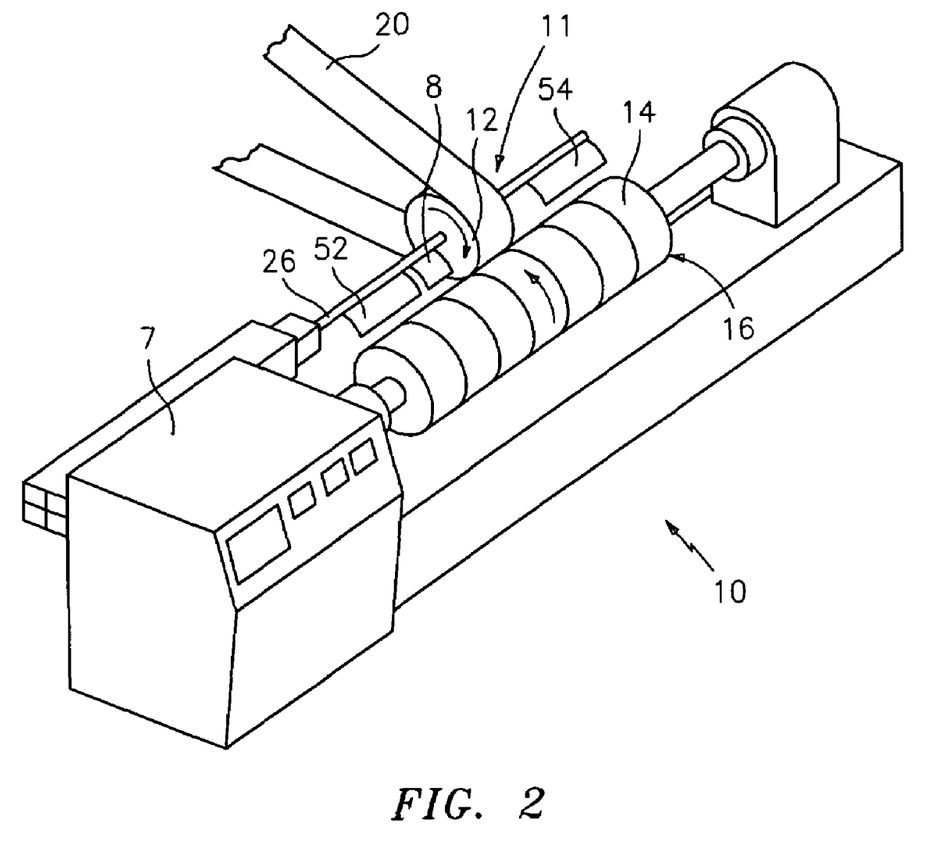
FIG. 2 depicts a different view of the thermal plate processor system of the invention and shows a reciprocating carriage for exposing, developing, and post-exposing/detacking a printing element.

As depicted in FIG. 2, the plate processor system (10) of the invention comprises a thermal developer (11) for thermally developing imaged and exposed surfaces of the flexographic printing element (16). The thermal developer (11) comprises means for softening or melting non-crosslinked photopolymer on the imaged and exposed surface of the flexographic printing element (16); at least one roll (12) that is contactable with an imaged surface (14) of a flexographic printing element (16) and is cable of moving over at least a portion of the imaged surface of the flexographic printing element (16) to remove the softened or melted non-crosslinked photopolymer on the imaged and exposed surface of the flexographic printing element (16); and means for maintaining contact between the at last one roll (12) and the imaged and exposed surface of the flexographic printing element (16).

The thermal developing apparatus removes non-crosslinked polymer from the imaged surface (14) of the flexographic printing element by rotating the at least one roll (12) over at least a portion of the imaged surface (14) of the flexographic printing element (16). Preferably, the at least one roll (12) rotates in a first direction (30) and the cylindrical flexographic printing element (16) rotates in an opposite direction (32) from the at least one roll (12).

The thermal developing apparatus also comprises means (shown in FIG. 2) for allowing the at least one roll (12) to traverse along the length of the cylindrical flexographic printing element, and such means typically comprise one or more reciprocating carriages (26). The advantage to this design feature is that movement of the roll across the surface of the printing element allows the improved thermal developing apparatus of the invention to accommodate printing elements of various lengths and diameters. In this case, the at least one roll (12) rotates along the length or around the circumference of the printing element and also moves in a direction parallel to the axis of rotation along the width of the printing element.

The means for softening or melting non-crosslinked photopolymer on the imaged and exposed surface of the flexographic printing element (16) may include heating at least one roll (12) that is moved over at least a portion of the imaged surface (14) of the flexographic printing element (16) and/or an external heating source (50) positioned prior to the roll (12) to soften or melt non-crosslinked polymer on the imaged and exposed surface of the flexographic printing element for subsequent removal by the roll (12). The external heating source (50) may also be used in conjunction with the heated roll (12). The external heating source (50), if used, is typically an infrared heater or hot air heater, although other heating sources could also be used and would be known to those skilled in the art. Preferably, the heating source is an infrared heater.

In one embodiment, the non-crosslinked photopolymer on the imaged and exposed surface of the flexographic printing element is melted or softened by heating the at least one roll that contacts the imaged and exposed surface of the flexographic printing element. In another embodiment, the non-crosslinked photopolymer on the imaged and exposed surface of the flexographic printing element is melted or softened by positioning a heater adjacent to the imaged and exposed surface of the flexographic printing element to soften or melt the non-crosslinked photopolymer for subsequent removal by the at least one roll. The heated roll and infrared heater may also be used together to facilitate additional removal of non-crosslinked photopolymer. If used, the at least one heated roll is typically maintained at a temperature that is between the melt temperature of the uncured photopolymer on the low end and the melt temperature of the cured photopolymer on the upper end. This will allow selective removal of the photopolymer thereby creating the image. Preferably the at least one heated roll is maintained at a temperature of about 350° F. to about 450° F.

The at least one roll that is contactable with the imaged and exposed surface of the flexographic printing element (16) may comprise two rolls (12) and (24) that are opposably positionable adjacent and apart from each other and are each maintainable in contact with the imaged surface (14) of the flexographic printing element (16). When the two rolls (12) and (24) are contacted with the imaged surface (14) of the flexographic printing element (16), the two rolls (12) and (24) are self-centering against the imaged surface (14) of the flexographic printing element (16).

Figure 5:
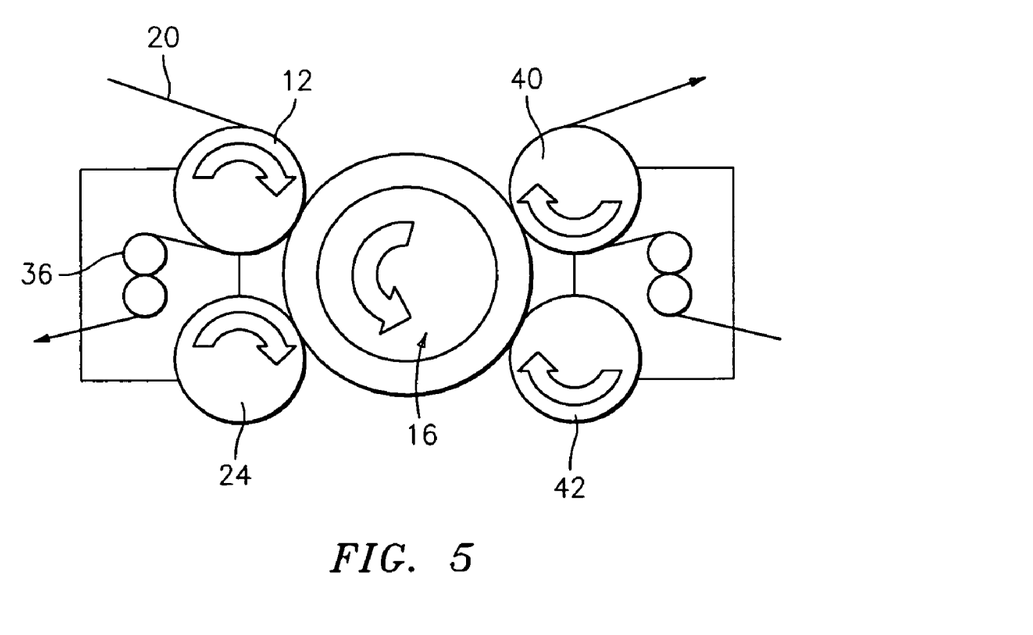
FIG. 5 depicts another embodiment of the thermal plate processor system of the instant invention wherein opposing heads are used to improve imaging speed and eliminate roll bending and machine stiffness design problems.

In another embodiment, as shown in FIG. 5, the thermal developer may further comprise one or more additional rolls (40) and (42) that are positionable in an opposing position on an opposite side of the cylindrical flexographic printing element (16). The one or more additional rolls (40) and (42) are maintainable in contact with at least a portion of the imaged surface (14) of the flexographic printing element (16). When the one or more additional rolls (40) and (42) are contacted with the imaged surface (14) of the flexographic printing element (16), removal of resin from the imaged surface (14) of the flexographic printing element (16) as well as the imaging speed can be increased. Use of the two additional rolls (40) and (42) may also eliminate roll bending and machine stiffness design problems, which can cause uneven floors in large flat plate machines. Also, since the high forces required to push the blotter into the resin oppose each other, the improved design features of the invention allow for the use of much lighter materials (i.e., fiberglass instead of steel support shafts) to support the printing sleeve while it is being processed.

The printing element is selectively exposed to actinic radiation. In a preferred embodiment, the printing element comprises a photopolymer layer that is coated with an actinic radiation (substantially) opaque layer, which typically comprises carbon black, and which is sensitive to laser ablation. A laser, which is preferably an infrared laser, is then used to ablate selected areas of the actinic radiation opaque layer creating an in situ negative. This technique is well-known in the art, and is described for example in U.S. Pat. Nos. 5,262,275 and 6,238,837 to Fan, and in U.S. Pat. No. 5,925,500 to Yang et al., the subject matter of each of which is herein incorporated by reference in its entirety.

The selected areas of the photopolymer layer revealed during laser ablation are then exposed to actinic radiation to crosslink and cure the portions of the photopolymer layer that are not covered by the in situ negative. The type of radiation used is dependent on the type of photoinitiator in the photopolymerizable layer. The radiation-opaque material in the infrared sensitive layer which remains on top of the photopolymerizable layer prevents the material beneath from being exposed to the radiation and thus those areas covered by the radiation-opaque material do not polymerize. The areas not covered by the radiation-opaque material are exposed to actinic radiation and polymerize and thus crosslink and cure.

As shown in FIG. 2, the improved plate processor system (10) of the invention may comprise one or more sources of actinic radiation (52) mounted on reciprocating carriage (26) to traverse the length of the flexographic printing element (16). The one or more sources of actinic radiation (52) typically comprise one or more UV light sources that are capable of selectively exposing and curing the imaged surface (14) of the flexographic printing element (16). However, any conventional sources of actinic radiation can be used for this exposure step, including, for example visible and UV sources such as carbon arcs, mercury-vapor arcs, fluorescent lamps, electron flash units, electron beam units and photographic flood lamps. If desired, the one or more sources of actinic radiation may include a filter to prevent undue heating of the flexographic printing element (16).

The reciprocating carriage (26) traverses the one or more sources of actinic radiation (52) over the length of the imaged surface (14) of the flexographic printing element (16) to cure the flexographic printing element (16). While the carriage (26) traverses the length of the imaged surface (14) of the flexographic printing element (16), the flexographic printing element (16) is continuously rotated in a first direction (30) so that the entire imaged surface of the flexographic printing element (16) is exposed to cure the imaged surface (14) of the flexographic printing element (16).

Figure 3:
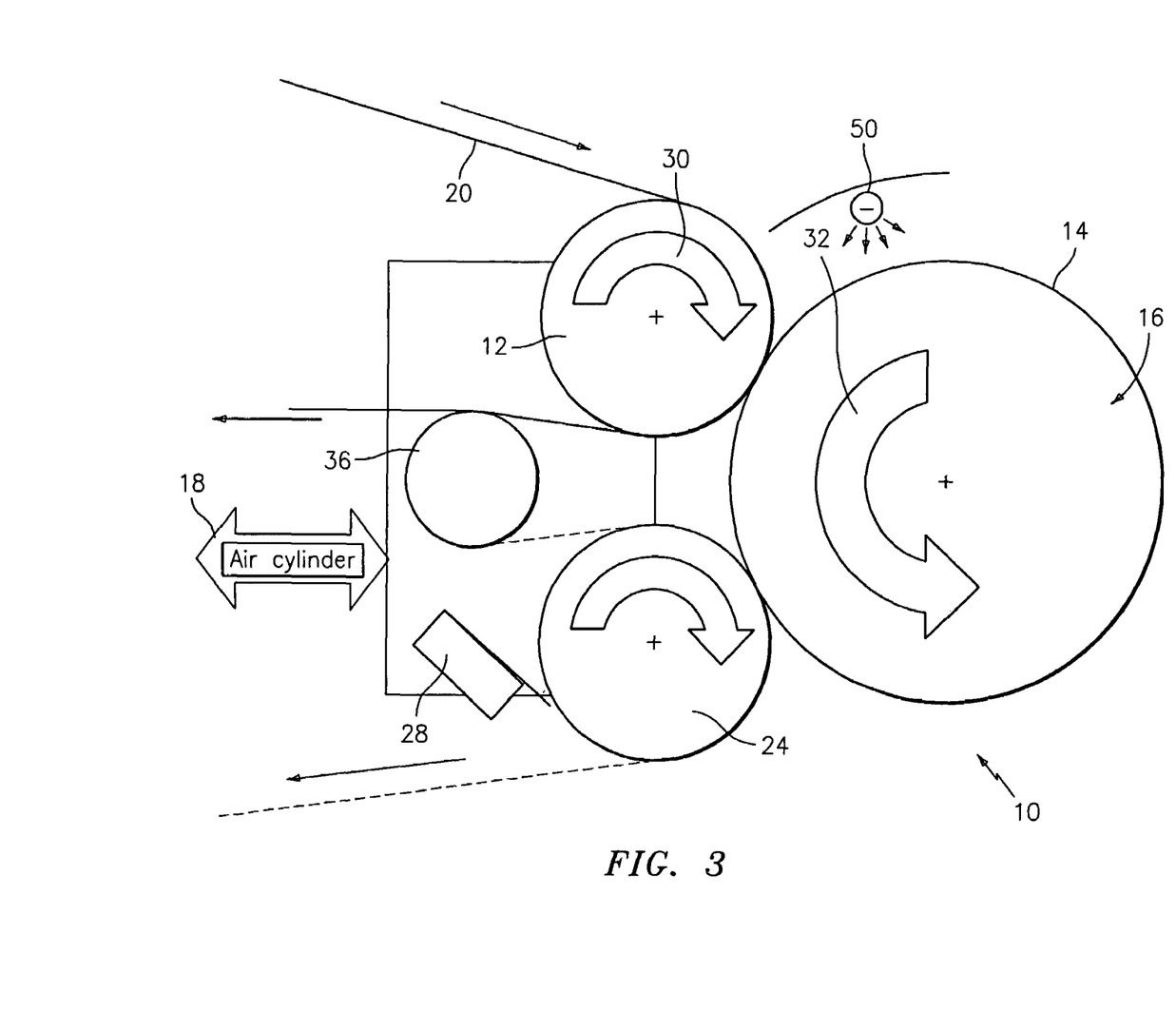
FIG. 3 depicts a view of the thermal developing portion of the thermal plate processor system of the invention.
Figure 4:
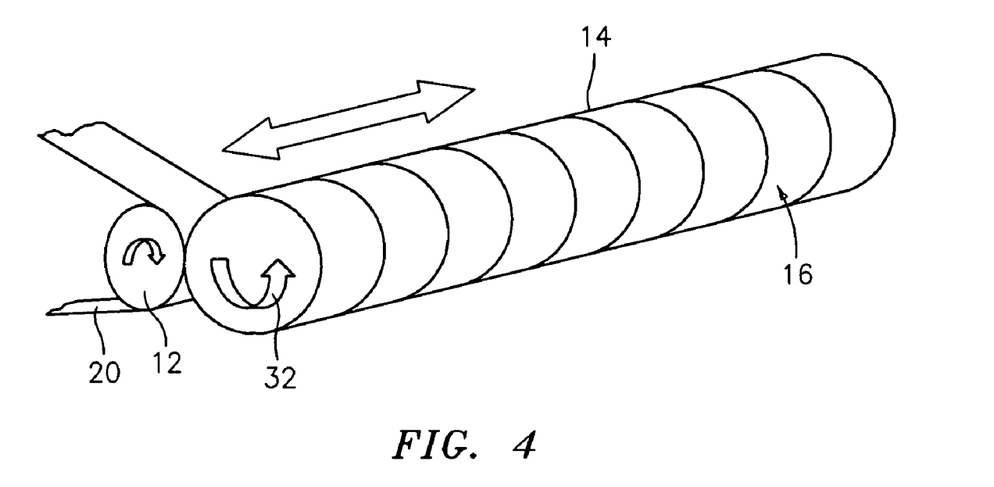
FIG. 4 depicts another view of the thermal developing portion of the thermal plate processor system and shows the motion of the heated roll traversing the length of the printing element.

The at least one roll (12) can be mounted on the same carriage (26) as the one or more sources of actinic radiation (52), or may be mounted on a separate carriage (not shown) from the one or more sources of actinic radiation (52). As shown in FIG. 3, the apparatus also contains means (18) for maintaining contact between the at least one roll (12) and the imaged surface (14) of the flexographic printing element (16).

Next, the photopolymer layer of the printing element is thermally developed to remove uncured (i.e., non-crosslinked) portions of the photopolymer, without disturbing the cured portions of the photopolymer layer, to produce the desired relief image. The at least one roll (12) is moved over at least a portion of the imaged surface (14) of the flexographic printing element (16) that has previously been traversed by the one or more sources of actinic radiation (52) to remove non-crosslinked polymer on the imaged surface (14) of the flexographic printing element (16).

In a preferred embodiment, the flexographic printing element (16) is rotated in the first direction (30), while the roll (12) is rotated in a second direction (32). The flexographic printing element (16) is continuously rotated in the first direction (30) during both the exposing and developing steps so that the entire imaged surface (14) of the flexographic printing element (16) can be exposed and developed. The spiral nature of this process, wherein the printing element rotates as the carriage (26) traverses the length of the flexographic printing element (16) ensures even exposure and development across any size printing element (16).

The means (18) for maintaining contact between the at least one roll (12) and the imaged surface (14) of the flexographic printing element (16) typically comprises an air cylinder or a hydraulic cylinder that acts to force the at least one roll (12) against the imaged surface (14) of the flexographic printing element (16). Other means for maintaining the contact between the at least one roll (12) and the flexographic printing element (16) would also be known to one skilled in the art.

In a preferred embodiment, a blotting material (20) is positioned on at least a portion of the at least one roll (12). Thus, when the at least one roll (12) is heated and is contacted with the imaged surface (14) of the flexographic printing element (16), non-crosslinked polymer on the imaged surface (14) of the flexographic printing element (16) is melted by the heated roll (12) and is removed by the blotting material (20). Alternately, the heating source (50) melts or softens the non-crosslinked polymer and the blotting material (20) positioned on at least a portion of the at least one roll removes the melted or softened polymer.

The blotting material (20) is typically looped under and around at least the portion of the at least one roll (12) that contacts the imaged surface (14) of the flexographic printing element (16). The blotting material (20) is continuously supplied to the at least one roll (12) from a remote source (not shown) of the blotting material (20). A rewind device (not shown) is used to carry away the blotting material (20) that contains the removed non-crosslinked polymer. The blotting material preferably comprises paper or woven or non-woven fabrics. Blotting materials that are usable include screen mesh and absorbent fabrics, including polymer-based and non-polymer-based fabrics.

In an alternate embodiment, the thermal developing apparatus comprises a doctor blade (28) that is positionable adjacent to the at least one roll (12) or (24), which is shown positioned adjacent to the second roll (24). The doctor blade is used in place of the blotting roll. When the at least one roll (24) removes non-crosslinked polymer from the imaged surface (14) of the flexographic printing element (16), the doctor blade (28) wipes the non-crosslinked polymer from the surface of the at least one roll (24).

The blotting material (20) may be continuously fed to the two rolls (12) and (24) by looping the blotting material (20) under and around at least the portion of the first roll (12) that is contactable with the imaged surface (14) of the flexographic printing element (16), looping the blotting material (20) around one or more track rolls (36) positioned between the two rolls (12) and (24), and then looping the blotting material (20) under and around at least the portion of the second roll (24) that is contactable with the imaged surface (14) of the flexographic printing element (16).

The improved plate processor system (10) of the invention may also comprise a device (54) for detacking and post-curing the flexographic printing element (16) once the flexographic printing element (16) has been exposed with the one or more UV lights (52) and thermally developed with the at least one roll (12) as shown in FIG. 2. The use of the detacking and post-curing device (54) in the system (10) of the invention eliminates the need for handling the printing element, i.e., moving the printing element to a subsequent apparatus, and again provides for a more precise and accurate printing element.

The present invention is also directed to a method of manufacturing a flexographic printing element. In a preferred embodiment, immediately prior to removal of the non-crosslinked polymer in a thermal developing step, the flexographic printing element is selectively exposed to actinic radiation to selectively crosslink and cure imaged portions of the flexographic printing element.

The method generally comprises the steps of:
a) securing the flexographic printing element on a suitable (i.e., rotatable) support;
b) coupling the rotatable support to a drive system to rotate the rotatable support;
c) exposing an imaged surface of the flexographic printing element to actinic radiation to crosslink and cure the imaged surface of the flexographic printing element;
d) melting or softening non-crosslinked polymer on the imaged and exposed surface of the flexographic printing element;
e) causing contact between the imaged surface of the flexographic printing element and at least one roll; and
f) rotating the at least one roll against at least a portion of the imaged surface of the flexographic printing element to remove the softened or melted non-crosslinked photopolymer from the imaged surface of the flexographic printing element;
g) optionally, but preferably, post exposing and detacking the imaged and developed flexographic printing element.

The at least one roll can traverse the length of the cylindrical flexographic printing element in a spiral or stepwise manner. In a preferred embodiment, the at least one roll traverses the length of the flexographic printing element one or multiple times until all of the non-crosslinked polymer is removed from the imaged surface of the flexographic printing element. The roll can also be angled such that its axis of rotation is not parallel with the axis of rotation of the flexographic printing element, and can be transverse to the axis of rotation of the flexographic printing element.

What is claimed is:

1. A plate processor system for manufacturing a flexographic printing element, the plate processor system comprising:
   a drive system;
   a rotatable support couplable to the drive system;
   means for securing the flexographic printing element on the rotatable support;
   means for exposing imaged surfaces of the flexographic printing element to actinic radiation;
   means for thermally developing the imaged and exposed surfaces of the flexographic printing element; and
   optionally, means for post-exposing and detacking the flexographic printing element wherein the means for thermally developing the imaged and exposed surfaces of the flexographic printing element comprises:
   a) means for softening or melting non-crosslinked photopolymer on the imaged and exposed surface of the flexographic printing element;
   b) at least one roll that is contactable with the imaged surface of the flexographic printing element and capable of moving over at least a portion of the imaged surface of the flexographic printing element to remove the softened or melted non-crosslinked photopolymer on the imaged and exposed surface of the flexographic printing element; and
   c) means for maintaining contact between the at least one roll and the imaged and exposed surface of the flexographic printing element;
   wherein further, the system comprises a means for allowing the at least one roll to traverse along the length of the printing element.

2. The system according to claim 1, wherein the flexographic printing element is a flat plate and the rotatable support is a mounting cylinder.

3. The system according to claim 2, wherein the means for securing the flexographic printing element on the mounting cylinder are selected from the group consisting of physical clamps, magnetic clamps, vacuum, and combinations of the foregoing.

4. The system according to claim 1, wherein the flexographic printing element is a substantially seamless photosensitive printing sleeve and the rotatable support is a mandrel.

5. The system according to claim 4, wherein the means for securing the printing sleeve to the mandrel comprises integrally forming the printing sleeve on the mandrel.

6. The system according to claim 4, wherein the means for securing the printing sleeve to the mandrel is an adhesive.

7. The system according to claim 1, wherein the drive system comprises one or more spacers to couple the rotatable support to the drive system, whereby the one or more spacers allow for the use of rotatable supports of varying lengths.

8. The system according to claim 1, comprising means for controlling the drive system, said control means comprising a microprocessor.

9. The system according to claim 8, further comprising means for controlling the operation of at least one of the means for exposing, the means for thermally developing, and the means for post-exposure/detacking.

10. The system according to claim 9, where the means for controlling the operation of at least one of the at least one of the means for exposing, the means for thermally developing, and the means for post-exposure/detacking further comprises one or more sensors for sensing the dimensions of the flexographic printing element and relaying information concerning the dimensions of the flexographic printing element to the drive system controller.

11. The system according to claim 1, wherein the means for exposing the imaged surface of the flexographic printing element to actinic radiation comprise one or more ultraviolet lights.

12. The system according to claim 11, wherein the one or more ultraviolet lights are mounted on a reciprocating carriage, and said reciprocating carriage traverses the length of the flexographic printing element as the flexographic printing element rotates in a first direction.

13. The system according to claim 1, wherein a blotting material is positioned on at least a portion of the at least one roll, and wherein when the at least one roll contacted with the imaged surface of the flexographic printing element, non-crosslinked polymer on the imaged surface of the flexographic printing element is removed by the blotting material.

14. The system according to claim 13, wherein the blotting material is looped under and around at least the portion of the at least one roll that contacts the imaged surface of the flexographic printing element.

15. The system according to claim 14, wherein the blotting material is continuously supplied to the at least one roll from a remote source of the blotting material.

16. The system according to claim 14, further comprising a rewind device to carry away the blotting material that contains the removed non-crosslinked polymer.

17. The system according to claim 1, wherein the means for maintaining contact between the at least one heatable roll and the imaged surface of the flexographic printing element comprises an air cylinder or a hydraulic cylinder that forces the at least one heatable roll against the imaged surface of the flexographic printing element.

18. The system according to claim 1, wherein the at least one roll rotates in a first direction and the flexographic printing element rotates in an opposite direction from the at least one roll.

19. The system according to claim 1, wherein the means for softening or melting non-crosslinked photopolymer on the imaged and exposed surface of the flexographic printing element comprises heating the at least one roll that contactable with the imaged surface of the flexographic printing element.

20. The system according to claim 1, wherein the means for softening or melting non-crosslinked photopolymer on the imaged and exposed surface of the flexographic printing element comprises positioning a heater adjacent to the imaged and exposed surface of the flexographic printing element.

21. The system according to claim 20, wherein the heater is an infrared heater or a hot air heater.

22. The system according to claim 19, further comprising a heater positioned adjacent to the imaged and exposed surface of the flexographic printing element to provide additional softening or melting of the non-crosslinked photopolymer on the imaged and exposed surface of the flexographic printing element.

23. A method of manufacturing a flexographic printing element comprising the steps of:
   a) securing the flexographic printing element on a rotatable support;
   b) coupling the rotatable support to a drive system to rotate the rotatable support;
   c) exposing an imaged surface of the flexographic printing element to actinic radiation to crosslink and cure the imaged surface of the flexographic printing element;
   d) melting or softening non-crosslinked polymer on the imaged and exposed surface of the flexographic printing element;
   e) causing contact between the imaged surface of the flexographic printing element and at least one roll;
   f) rotating the at least one roll against at least a portion of the imaged surface of the flexographic printing element to removed the melted or softened non-crosslinked polymer from the imaged surface of the flexographic printing element; and
   g) optionally, post-exposing and detacking the imaged and developed flexographic printing element wherein the at least one roll traverses the length of the flexographic printing element.

24. The method according to claim 23, wherein the flexographic printing element is a flat plate and the rotatable support is a mounting cylinder.

25. The method according to claim 24, wherein the flexographic printing element is secured to the mounting cylinder by means selected from the group consisting of physical clamps, magnetic claims, vacuum, and combinations of the foregoing.

26. The method according to claim 23, wherein the flexographic printing element is a substantially seamless printing sleeve and the rotatable support is a mandrel.

27. The method according to claim 26, wherein the printing sleeve is integrally formed on the mandrel.

28. The method according to claim 26, wherein the printing sleeve is secured on the mandrel using an adhesive.

29. The method according to claim 23, wherein the drive system comprises one or more spacers for coupling the rotatable support to the drive system, whereby rotatable supports of various lengths may be used.

30. The method according to claim 23, wherein the one or more sources of actinic radiation comprise one or more ultraviolet lights.

31. The method according to claim 30, wherein the one or more sources of actinic radiation traverse the length of the flexographic printing element.

32. The method according to claim 23, wherein the at least one roll traverses the length of the flexographic printing element multiple times.

33. The method according to claim 32, wherein the at least one roll traverses the length of the flexographic printing element in a spiral or stepwise manner.

34. The method according to claim 31, wherein the at least one roll rotates in a first direction and the flexographic printing element rotates in an opposite direction from the at least one roll.

35. The method according to claim 31, wherein an air cylinder or a hydraulic cylinder is used to maintain contact between the at least one roll and the imaged surface of the flexographic printing element.

36. The method according to claim 31, wherein at least the portion of the at least one roll that is in contact with the imaged surface of the flexographic printing element is covered with a blotting material and the blotting material removes the non-crosslinked polymer from the imaged surface of the flexographic printing element.

37. The method according to claim 36, wherein the blotting material is looped under and around at the least the portion of the at least one roll that is in contact with the imaged surface of the flexographic printing element.

38. The method according to claim 37, wherein the blotting material is continuously fed to the at least one roll from a remote source of the blotting material.

39. The method according to claim 38, wherein the blotting material that contains the removed non-crosslinked photopolymer is rewound onto a rewind device.

40. The method according to claim 36, wherein the non-crosslinked photopolymer on the imaged and exposed surface of the flexographic printing element is melted or softened by heating the at least one roll that contacts the imaged and exposed surface of the flexographic printing element.

41. The method according to claim 36, wherein the non-crosslinked photopolymer on the imaged and exposed surface of the flexographic printing element is melted or softened by positioning a heater adjacent to the imaged and exposed surface of the flexographic printing element.

42. The method according to claim 40, further comprising a heater positioned adjacent to the imaged and exposed surface of the flexographic printing element to provide additional melting or softening of the non-crosslinked photopolymer.

* * * * *

UNITED STATES PATENT AND TRADEMARK OFFICE
CERTIFICATE OF CORRECTION

PATENT NO. : 7,237,482 B2
APPLICATION NO. : 11/055196
DATED : July 3, 2007
INVENTOR(S) : Ryan Vest et al.

Page 1 of 1

It is certified that error appears in the above-identified patent and that said Letters Patent is hereby corrected as shown below:

Column 13

Line 53, delete "removed" and replace it with --remove--

Signed and Sealed this

Twenty-eighth Day of August, 2007

JON W. DUDAS
*Director of the United States Patent and Trademark Office*